United States Patent
Patil et al.

(10) Patent No.: US 6,830,646 B2
(45) Date of Patent: Dec. 14, 2004

(54) RADIATION CURABLE RESIN LAYER

(75) Inventors: Girish S. Patil, Lexington, KY (US);
Brian C. Hart, Georgetown, KY (US)

(73) Assignee: Lexmark International, Inc., Lexington, KY (US)

( * ) Notice: Subject to any disclaimer, the term of this patent is extended or adjusted under 35 U.S.C. 154(b) by 61 days.

(21) Appl. No.: 10/418,782

(22) Filed: Apr. 18, 2003

(65) Prior Publication Data

US 2003/0207209 A1 Nov. 6, 2003

Related U.S. Application Data

(60) Division of application No. 10/413,040, filed on Apr. 14, 2003, which is a continuation-in-part of application No. 09/652,280, filed on Aug. 30, 2000, now abandoned.

(51) Int. Cl.[7] .............................. G03F 7/004; G03F 7/40
(52) U.S. Cl. .................... 156/292; 156/310; 156/335; 430/280.1; 430/319; 347/48
(58) Field of Search ................... 347/48; 430/280.1, 430/319; 156/310, 335, 292; 522/170, 146, 31, 25

(56) References Cited

U.S. PATENT DOCUMENTS

| | | | | |
|---|---|---|---|---|
| 4,401,537 A | * | 8/1983 | Chern et al. | 522/31 |
| 5,762,812 A | * | 6/1998 | Narang | 216/27 |
| 5,907,333 A | * | 5/1999 | Patil et al. | 347/20 |
| 5,945,253 A | * | 8/1999 | Narang et al. | 430/280.1 |
| 2003/0170567 A1 | * | 9/2003 | Patil et al. | 430/280.1 |

\* cited by examiner

*Primary Examiner*—Cynthia Hamilton
(74) *Attorney, Agent, or Firm*—Luedeka, Neely & Graham, P.C.

(57) ABSTRACT

A radiation curable resin formulation suitable for planarizing an ink jet heater chip. The resin formulation includes a multifunctional epoxy component, a difunctional epoxy component, a silane coupling agent, an aryl sulfonium salt photoinitiator, and a non-photoreactive solvent. The resin formulation is substantially devoid of acrylate polymer components. Radiation curable resins according to the invention exhibit enhanced adhesion with the nozzle plate adhesive thereby reducing the incidence of delamination between the nozzle plate and a semiconductor chip containing the resin layer. Another advantage is that the resin layer, according to the invention, reduces pigment flocculation on the surface of the resin layer when using pigment-based ink jet inks.

10 Claims, 2 Drawing Sheets

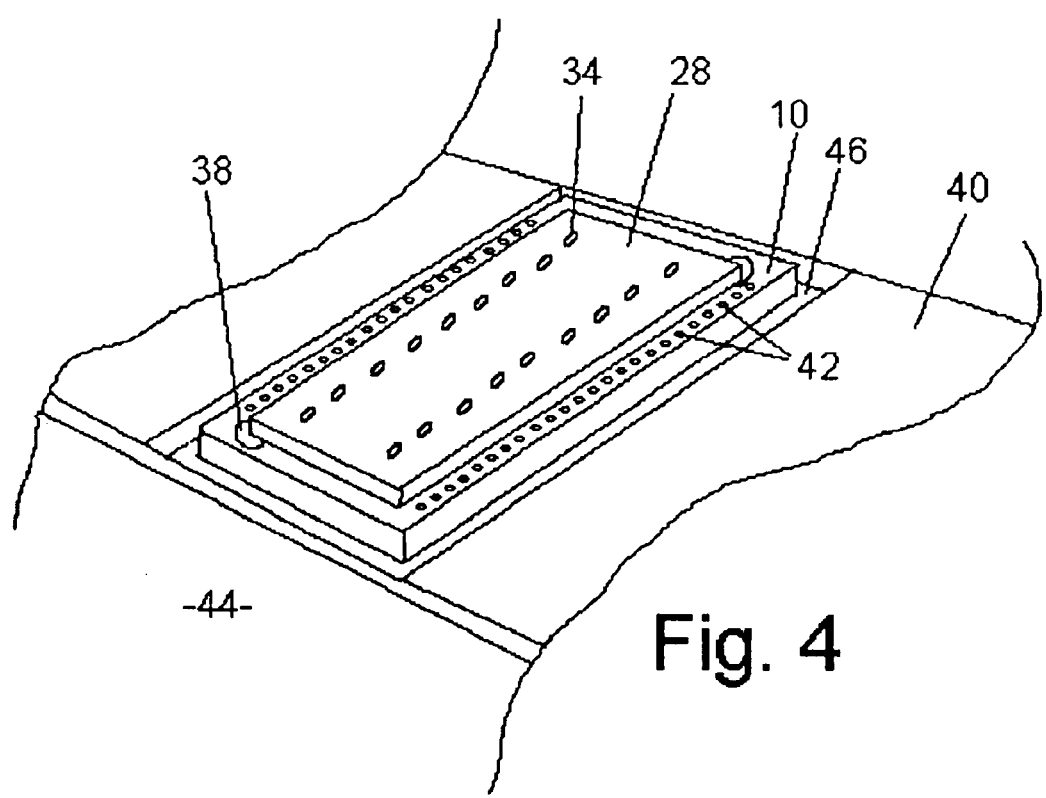

US 6,830,646 B2

RADIATION CURABLE RESIN LAYER

RELATED APPLICATION

This application is a division of application Ser. No. 10/413,040, filed Apr. 14, 2003, which is a continuation-in-part of application Ser. No. 09/652,280, filed Aug. 30, 2000, now abandoned.

FIELD OF THE INVENTION

The invention relates to improved radiation curable resin formulations and to methods for attaching a semiconductor chip to a nozzle plate for an ink jet pen using the improved radiation curable resin formulation.

BACKGROUND OF THE INVENTION

Ink jet printers continue to evolve as the technology for ink jet printing continues to improve to provide higher speed, higher quality printers. The improvement in speed and quality does not come without a price, however. The ink jet pens of such printers are more costly to manufacture because of tighter alignment tolerances which must be met for the operative parts of the printers. One area of increased criticality is the alignment tolerance between the nozzle plate and semiconductor chip components of the ink jet pen.

During the manufacture of an ink jet pen for a thermal ink jet printhead, nozzle plates are aligned with semiconductor chips on the wafer so that heater resistors on the semiconductor chip used for heating the ink align with nozzle holes on the nozzle plate. Misalignment between the heater resistors and the nozzle holes has a disadvantageous effect on the accuracy of ink droplet placement of ink ejected from the nozzle holes to the print media. Heater resistor and nozzle plate alignment also has an effect on the mass and velocity of the ink droplet ejected through the nozzle hole.

There are multiple manufacturing steps required to produce an ink jet pen. First resistive, conductive and insulative metal layers are deposited on a silicon wafer to define individual semiconductor chips. Some of the layers, such as the resistive layers are disposed on discrete locations on each chip. Accordingly, the surface of the chips, on a microscopic scale, is substantially irregular or non-planar. The irregularities on the chip surface may cause poor adhesion between the nozzle plate and chip, misalignment of the nozzle holes in the nozzle plate with respect to the ink activators on the semiconductor chip, or in the worst case, delamination between the nozzle plate and chip.

Once the conductive, resistive and insulative layers are deposited on the wafer, and individual chips are defined, individual nozzle plates are attached to the chips after aligning the nozzle plates and chips to one another. The nozzle plate/chip assembly is then excised from the wafer and a TAB circuit or flexible circuit is then electrically connected to each of the semiconductor chips using a wire bonding or TAB bonding process. The resulting nozzle/plate chip and circuit assemblies are then each attached to a cartridge body in a chip pocket thereon using a die bond adhesive. Finally the TAB circuit or flexible circuit portion of the assembly is adhesively attached to the cartridge body. Because of the multiple adhesives used for making the ink jet pen, there are typically several curing steps required during the assembly of the pen components. With each assembly and curing step there is an opportunity for component misalignment to occur. Furthermore, handling of the pen during the assembly steps may cause delamination between the nozzle plates and chips.

Despite advances made in the art manufacturing ink jet pens for ink jet printers, there remains a need for improved formulations and methods for attaching nozzle plates to semiconductor chips for ink jet pens.

SUMMARY OF THE INVENTION

With regard to the foregoing and other objects, the invention provides a radiation curable resin formulation suitable for planarizing an ink jet heater chip. The resin formulation includes a multifunctional epoxy component, a difunctional epoxy component having a weight average molecular weight above about 2500, a silane coupling agent, an aryl sulfonium salt photoinitiator, and a non-photoreactive solvent. The resin formulation is substantially devoid of acrylate polymer components and the resin formulation contains from about 60 to about 85 weight percent of the difunctional epoxy component and from about 12 to about 22 weight percent of the photoinitiator based on the weight of the cured resin.

In another aspect the invention provides a method for making an ink jet pen for an ink jet printer. According to the method, a resin layer containing radiation curable resin formulation is applied to a surface of a semiconductor chip containing resistive and conductive layers on the surface thereof. The radiation curable resin formulation includes a multifunctional epoxy component, a difunctional epoxy component having a weight average molecular weight above about 2500, a silane coupling agent, an aryl sulfonium salt photoinitiator, and a non-photoreactive solvent. The resin formulation is substantially devoid of acrylate polymer components. After applying the resin layer to the surface, solvent is removed from the resin layer, and the resin layer is cured by exposure to actinic radiation to provide a cured resin layer. A nozzle plate is aligned and attached to the semiconductor chip with an adhesive to provide a nozzle plate/chip assembly. A TAB circuit or flexible circuit is attached to the nozzle plate/chip assembly. The cured resin layer contains from about 60 to about 85 weight percent of the difunctional epoxy component and from about 12 to about 22 weight percent of the photoinitiator.

In yet another aspect the invention provides a printhead for an ink jet printer. The printhead includes a cartridge body containing one or more pens attached thereto. Each pen includes a nozzle plate, a semiconductor chip having a device surface attached to the nozzle plate, a flexible circuit or TAB circuit attached to the semiconductor chip and a radiation cured resin layer applied to the device surface of the semiconductor chip in order to planarize the surface of the chip. The radiation cured resin layer is derived from a radiation curable resin formulation containing a multifunctional epoxy component, a difunctional epoxy component having a weight average molecular weight above about 2500, a silane coupling agent, a non-photoreactive solvent, and an aryl sulfonium salt photoinitiator. The resin formulation is substantially devoid of acrylate polymer components and the cured resin layer contains from about 60 to about 85 weight percent of the difunctional epoxy component and from about 12 to about 22 weight percent of the photoinitiator.

An advantage of the compositions and methods according to the invention is an improved adhesion between the nozzle plate adhesive and the radiation curable resin layer thereby reducing the incidence of delamination that may occur. The radiation curable resin layer also passivates the resistive and conductive metal layers on the chip and protects the layers from corrosion caused by components in the ink jet ink formulations. Enhanced protection of the circuitry from handling damage and debris is also provided by the radiation curable resin layer according to the invention. Other advantages of the radiation curable resin layer are that there is a substantial reduction in pigment flocculation on the surface of resin layer and the shelf life is believed to be substantially greater than with formulations containing acrylate polymer components such as polymethyl methacrylate resin.

For purposes of the invention, "difunctional epoxy materials" means materials having only two epoxy functional groups in the compound. "Multifunctional epoxy materials" means epoxy materials having more than two epoxy functional groups in the compound.

BRIEF DESCRIPTION OF THE DRAWINGS

Further advantages of the invention will become apparent by reference to the detailed description when considered in conjunction with the figures, which are not to scale, wherein like reference numbers indicate like elements through the several views, and wherein:

FIG. 4 is a perspective view of a portion of an ink jet printhead according to the invention.

DETAILED DESCRIPTION OF THE INVENTION

Figure 1:
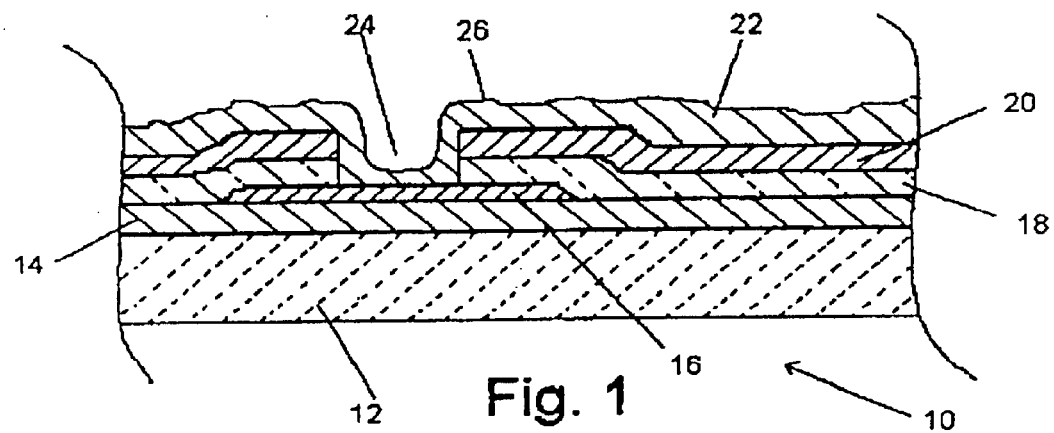
FIG. 1 is a cross-sectional view not to scale of a portion of a semiconductor chip containing resistive, conductive and insulative layers.

With reference to FIG. 1, there is shown, in partial cross-sectional view, a portion of a semiconductor chip 10 for an ink jet pen. The chip includes a silicon substrate layer 12, a silicon dioxide passivation layer 14, a resistive layer 16 preferably of aluminum and copper or other resistive metal such as beta-phase tantalum, a conductive layer 18 such as alpha-phase tantalum, gold or the like, a passivation layer 20 such as silicon carbide and/or silicon nitride and a cavitation layer 22 of tantalum. The heater resistor area 24 for heating the ink is provided adjacent the resistive layer 16 which is covered with the passivation layer 20 and the cavitation layer 22. As seen in FIG. 1, exposed surface 26 of the chip 10 also referred to herein as the "device surface" is substantially non-planar and may contain pits. For that matter, each of the foregoing layers, on a microscopic scale, has a substantially non-planar surface so that the irregularities of surface 26 may be magnified many times by the combination of layers.

Figure 2:
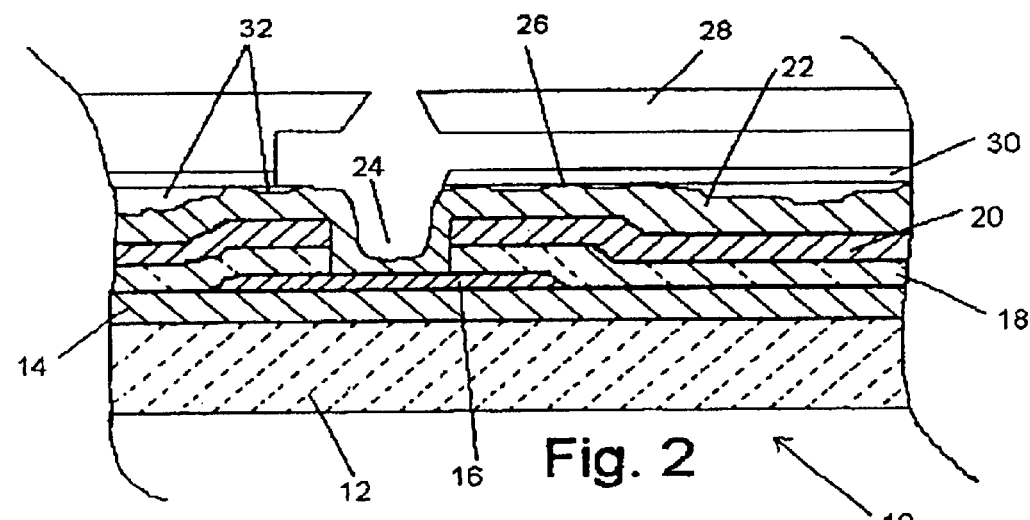
FIG. 2 is a cross-sectional view not to scale of a portion of a semiconductor chip having a nozzle plate attached to the chip.

As seen in FIG. 2, attachment of a nozzle plate 28 to a chip 10 to provide a nozzle plate/chip assembly 28/10 using an adhesive 30 applied to the nozzle plate 28 may provide substantial areas of non-contact or gaps 32 between the nozzle plate adhesive 30 and the surface 26 of cavitation layer 22. The gaps 32 not only reduce the adhesive force between the nozzle plate 28 and the chip surface 26, they also may trap air between the nozzle plate 28 and chip 10 which may cause delamination of the nozzle plate/chip assembly 28/10 during various of the manufacturing steps for an ink jet pen.

A flexible circuit or TAB circuit is electrically connected to the conductive layer 18 on the semiconductor chip 10 to provide electrical impulses for ejecting ink from selected nozzle holes 34 as described in more detail below. Flexible circuits and TAB circuits are resilient polymeric films which contain electrical traces thereon for conducting electrical signals from a source to a device connected to the traces of the flexible or TAB circuit. Each ink jet printhead may contain a single ink jet pen for a single color ink, such as black, cyan, magenta or yellow or may contain multiple pens for multiple colors of ink.

An important aspect of the invention is the planarization of the surface 26 of the chip 10 with a radiation curable resin layer 36 prior to attaching the nozzle plate 28 to the chip 10. Accordingly, a radiation curable resin formulation is prepared and applied to the surface 26 of the chip. The resin formulation includes a multifunctional epoxy component, a difunctional epoxy component, a silane coupling agent and a mixed aryl sulfonium salt photoinitiator. A non-photoreactive solvent is used to apply the resin formulation to the surface 26 of the chip 10.

The multifunctional epoxy component of the resin used for planarization layer 36 may be selected from aromatic epoxides such as glycidyl ethers of polyphenols. A particularly preferred multifunctional epoxy resin is a polyglycidyl ether of phenolformaldeyhyde novolac resin such as the novolac epoxy resin having an epoxide equivalent weight ranging from about 172 to about 179 and a viscosity at 25° C. ranging from about 3,000 to about 5,000 centipoise which is available from Dow Chemical Company of Midland, Mich. under the trade name D.E.N. 431. The amount of multifunctional epoxy resin in the radiation curable resin formulation preferably ranges from about 5 to about 15 percent by weight based on the weight of the cured resin, most preferably from about 8 to about 10 percent by weight based on the weight of the cured resin.

The difunctional epoxy component of the radiation curable resin formulation is preferably selected from difunctional epoxy compounds which include diglycidyl ethers of bisphenol-A (e.g. those available under the trade designations "EPON 1007F", "EPON 1007" and "EPON 1009F", available from Shell Chemical Company of Houston, Tex., "DER-331", "DER-332", and "DER-334", available from Dow Chemical Company of Midland, Mich., 3,4-epoxycyclohexylmethyl-3,4-epoxycyclo-hexene carboxylate (e.g. "ERL-4221" available from Union Carbide Corporation of Danbury, Conn., 3,4-epoxy-6-methylcyclohexylmethyl-3,4-epoxy-6-methylcyclohexene carboxylate (e.g. "ERL-4201" available from Union Carbide Corporation), bis(3,4-epoxy-6-methylcyclohexylmethyl) adipate (e.g. "ERL-4289" available from Union Carbide Corporation), and bis(2,3-epoxycyclopentyl) ether (e.g. "ERL-0400" available from Union Carbide Corporation.

A particularly preferred difunctional epoxy resin is a bisphenol-A/epichlorohydrin epoxy resin available from Shell Chemical Company of Houston, Tex. under the trade name EPON resin 1007F having an epoxide equivalent of greater than about 1000. An "epoxide equivalent" is the number of grams of resin containing 1 gram-equivalent of epoxide. The weight average molecular weight of the difunctional epoxy is preferably above about 2500 and most preferably from about 2800 to about 3500 weight average molecular weight. The amount of difunctional epoxy component in the radiation curable resin preferably ranges from about 50 to about 85 percent by weight based on the weight of the cured resin, most preferably from about 65 to about 75 percent by weight based on the weight of the cured resin.

As set forth above, the radiation curable resin formulation also preferably contains a photoinitiator. The photoinitiator is preferably a compound or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating moieties which initiate reactions with epoxides. The aromatic complex salt is preferably present in the radiation curable resin in an amount ranging from about 12 to about 22 weight percent, preferably from about 15 to about 20 weight percent, based on the weight of the cured resin.

Of the aromatic complex salts which are suitable for use in the compositions of the invention the preferred salts are triaryl-substituted sulfonium salts. The triaryl-substituted salts are preferred because they are generally more thermally stable than the mono- and diaryl substituted salts. The triaryl-substituted complex salts are also more amenable to dye sensitization. Consequently, the use of such complex salts results in compositions which are much more useful in applications where cure is initiated with actinic radiation such as near ultraviolet or visible light. Examples of triaryl-substituted sulfonium complex salt photoinitiators include:

triphenylsulfonium tetrafluoroborate triphenylsulfonium hexafluorophosphate triphenylsulfonium hexafluoroantimonate tritolysulfonium hexafluorophosphate anisyldiphenylsulfonium hexafluoroantimonate 4-butoxyphenyidiphenylsulfonium tetrafluoroborate 4-chlorophenyidiphenylsulfonium hexafluoroantimonate 4-acetoxy-phenyldiphenylsulfonium tetrafluoroborate 4-acetamidophenyldiphenylsulfonium tetrafluoroborate Of the triaryl-substituted sulfonium complex salts which are suitable for use in the compositions of the invention the most preferred salt is a mixture of triarylsulfonium hexafluoroantimonate salt, commercially available from Union Carbide Corporation under the trade name CYRACURE UVI-6974.

The radiation curable resin formulation also preferably includes an effective amount of a film enhancing agent such as a silane coupling agent having a functional group capable of reacting with at least one member selected from the group consisting of the multifunctional epoxy compound, the difunctional epoxy compound and the photoinitiator. Such a silane coupling agent is preferably a silane with an epoxide functional group such as a glycidoxyalkyl-trialkoxysilane like gamma-glycidoxypropyltrimethoxy-silane. The coupling agent is preferably present in the cured resin in an amount ranging from about 0.5 to about 5.0 weight percent and preferably from about 1.5 to about 2.0 weight percent based on total weight of the cured resin, including all ranges subsumed therein. Coupling agents, as used herein, are defined to mean organic materials soluble in the resin composition which assist the film forming characteristics of the resin composition on the surface 26 of the chip 10.

In order to prepare the radiation curable resin for use according to the invention, a suitable solvent is used. A suitable solvent is a solvent which is preferably non-photoreactive. Non-photoreactive solvents include, but are not limited gamma-butyrolactone, $C_{1-6}$ acetates, tetrahydrofuran, low molecular weight ketones, mixtures thereof and the like. A particularly preferred non-photoreactive solvent is acetophenone. The non-photoreactive solvent is present in the formulation mixture used to prepare the photocurable resin in an amount ranging of from about 20 to about 90 weight percent, preferably from about 45 to about 75 weight percent, based on the total weight of the resin mixture. The non-photoreactive solvent preferably does not remain in the cured resin layer 36 and is thus is removed prior to or during the resin curing steps.

According to a preferred procedure, non-photoreactive solvent and difunctional epoxy compound are mixed together in a suitable container such as an amber bottle or flask and the mixture is put in a roller mill overnight at about 60° C. to assure suitable mixing of the components. After mixing the solvent and difunctional epoxy compound, the multifunctional epoxy compound is added to the container and the resulting mixture is rolled for two hours on a roller mill at about 60° C. The other components, the photoinitiator and the film enhancing agent, are also added one at a time to the container and the container is rolled for about two hours at about 60° C. after adding each component to the container to provide a wafer coating mixture.

The coating mixture of the invention may also contain various additives such as conventional fillers (e.g. barium sulfate, talc, glass bubbles) viscosity modifiers (e.g. pyrogenic silica), pigments, etc. These fillers may be used to control the viscosity of the coating mixture.

An important feature of the photocurable resin layer is that the coating formulation and resulting resin layer 36 are substantially devoid of acrylate or methacylate polymers. Without desiring to be bound by theory, it is believed that the higher molecular weight difunctional epoxy material contributes sufficient thermoplastic properties to the resin layer 36 to enable use of a photocurable resin layer which is substantially devoid of acrylate or methacylate polymers. It is also believed that the acrylate and methacylate polymers contribute to pigment flocculation when using pigment-based ink jet inks and to increased delamination failure between the nozzle plate 28 and surface 26 of the chip 10 when the layer and chips were baked at temperatures sufficient to reduce pigment flocculation on the surface of layer 36. An added feature of the invention is that the coating mixture, substantially devoid of acrylate or methacylate polymers, has an increased shelf life as compared to the same coating mixture containing acrylate or methacrylate polymers.

In order to apply the photocurable resin formulation to the surface 26 (FIG. 3) to planarize surface 26, a silicon wafer is centered on an appropriate sized chuck of either a resist spinner or conventional wafer resist deposition track. The coating mixture is either dispensed by hand or mechanically into the center of the wafer. The chuck holding the wafer is then rotated at a predetermined number of revolutions per minute to evenly spread the coating mixture from the center of the wafer to the edge of the wafer. The rotational speed of the wafer may be adjusted or the viscosity of the coating mixture may be altered to vary the resulting resin film thickness. Rotational speeds of 2500 rpm or more may be used. The amount of resin film applied to surface 26 should be sufficient to substantially planarize the surface. Accordingly, the thickness of layer 36 may vary depending on the actual surface irregularity to be planarized. A layer 36 thickness ranging from about 1 to about 5 microns is generally sufficient for most silicon wafers.

The resulting coated silicon wafer is then removed from the chuck either manually or mechanically and placed on either a temperature controlled hotplate or in a temperature controlled oven at a temperature of about 90° C. for about 30 seconds to about 1 minute until the material is "soft" baked. This step removes at least a portion of the solvent from the photocurable resin layer 36 resulting in a partially dried film on the chip surface 26. The silicon wafer is removed from the heat source and allowed to cool to room temperature.

In order to define patterns in the photocurable resin layer 36 such as the heater resister area 24, the layer is masked, exposed to a radiation source, baked after exposure and developed to define the final pattern by removing unneeded material. Curing of the photocurable resin of the invention occurs on exposure of the coating mixture to any suitable source of radiation emitting actinic radiation at a wavelength within the ultraviolet and visible spectral regions. Exposures may be from less than about 1 second to 10 minutes or more, preferably about 5 seconds to about one minute, depending upon the amounts of particular epoxy materials and aromatic complex salts being utilized and depending upon the radiation source and distance from the source and the thickness of the layer to be cured. The resin may also be cured by exposure to electron beam irradiation. This procedure is very similar to a standard semiconductor lithographic process. The mask is a clear, flat substrate usually glass or quartz with opaque areas defining the pattern to be removed from the layer 36 (i.e. negative acting photoresist). The opaque areas prevent the ultraviolet light from cross-linking the layer masked beneath it. The exposed layer 36 is baked at a temperature of about 90° C. for about 30 seconds to about 10 minutes, preferably from about 1 to about 5 minutes to complete curing of the resin layer 36.

The non-cross linked material in resin layer 36 is then solubilized by a developer and the solubilized material is removed leaving the predetermined pattern behind on the chip surface 26. The developer comes in contact with the coated silicon wafer through either immersion and agitation in a tank-like setup or by spray. Either spray or immersion of the wafer will adequately remove the excess material as defined by the photo masking and exposure. Illustrative developers include, for example, butyl cellosolve acetate, a xylene and butyl cellosolve acetate mixture and $C_{1-6}$ acetates like butyl acetate. After developing the layer 36, the wafer containing layer 36 is optionally baked at temperature ranging from about 150° C. to about 200° C., preferably from about from about 170° C. to about 190° C. for about 1 minute to about 60 minutes, preferably from about 15 to about 30 minutes.

In order to demonstrate the improved adhesion exhibited by the compositions and methods of the invention, a series of peel tests were performed comparing a conventional planarizing material containing acrylate polymer components as set forth in U.S. Pat. No. 5,907,333 to Patil et al. with the planarizing material made according to the invention. Both materials were spin-coated onto silicon wafers and the photoresist materials were developed and cured as described above under the similar conditions. The wafers were grit blasted to make via openings in the chips. Nozzle plates were optically aligned and attached to the planarized wafers by means of thermal compression bonding and the wafers containing nozzle plates were baked to cure the nozzle plate adhesives. The wafers were diced and individual nozzle plate/chip assemblies were selected for testing.

Some of the nozzle plate/chip assemblies were submerged in a jar of pigment based ink at about 60° C. for 0 to 16 weeks. The nozzle plate/chip assemblies were removed from the ink and placed horizontally in a sliding fixture under a tensile testing machine. A razor blade was used to peel the end of the nozzle plate from the chip. A clip from the tensile testing arm of the machine was attached to the peeled portion of the nozzle plate and the entire nozzle plate was peeled at an angle of 90° from the chip. The strength in grams was recorded as the peel strength. The peel strength in grams of two or three nozzle plate/chip assemblies were averaged for each set of data. The results are given in the following table.

|  | Week 0 | Week 2 | Week 4 | Week 8 | Week 16 | Average |
| --- | --- | --- | --- | --- | --- | --- |
| Fomulation 1[1] | 28 grams | 25 grams | 18 grams | 30 grams | 27 grams | 28 grams |
| Formulation 2[2] | 170 grams | 275 grams | 350 grams | 280 grams | 250 grams | 258 grams |

[1]Formulation 1 is a planarizing material made according to U.S. Pat. No. 5,907,333. The cured resin contains 47.1 wt. % ELVACITE 2008, 37.7 wt. % EPON 1001F, 4.7 wt. % D.E.N. 431, 9.5 wt. % CYRACURE 6974 and 0.9 wt. % 3-glycidoxypropyltrimethoxy silane. ELVACITE 2008 is a low molecular weight polymethylmethacrylate containing 2–3% carboxylic acid functionality available from ICI Americas, Inc. of Arlington, VA. The resin was coated on the silicon wafers from a gamma-butyrolactone solvent.
[2]Formulation 2 is a planarizing material made according to the invention. The cured resin contains 72 wt. % EPON 1007F, 9.0 wt. % D.E.N. 431, 18.1 wt. % CYRACURE 6974, 0.9 wt. % 3-glydicoxypropyltrimethoxysilane. The resin was coated on the silicon wafers from an acetophenone solvent.

As seen by comparing the peel test using planarizing materials with or without acrylate polymer components, the planarizing materials according to the invention exhibited substantially greater peel strength. The large difference in peel strength was totally unexpected and represents a significant improvement in adhesion between the nozzle plate and chip of the nozzle plate/chip assembly.

Figure 3:
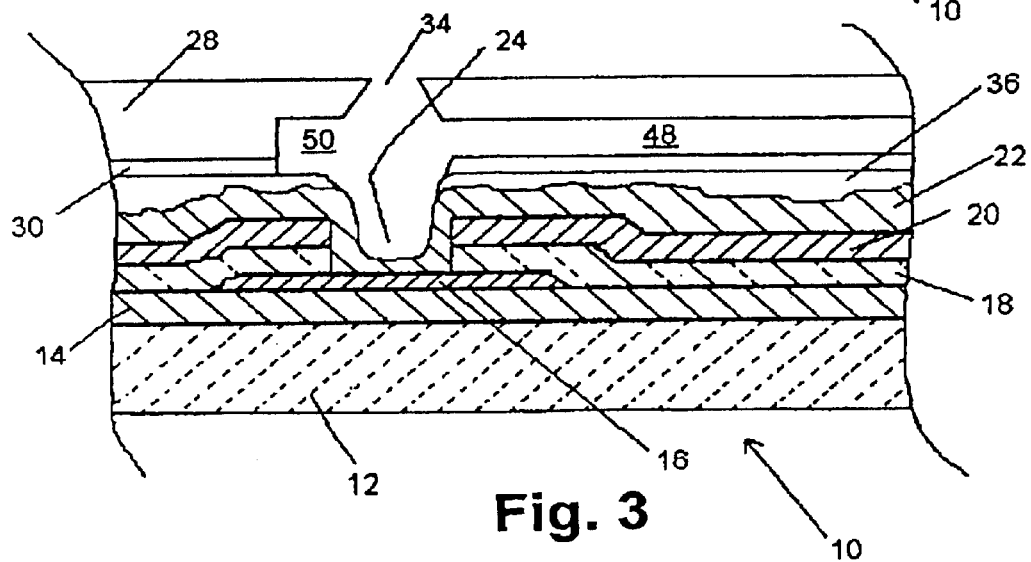
FIG. 3 is a cross-sectional view, not to scale of a portion of a nozzle plate chip assembly according to the invention.

Referring to FIG. 3 and FIG. 4, a partial cross-sectional view of nozzle plate 28 and semiconductor chip 10 attached to one another after developing and curing the photocurable resin layer 36 is illustrated. The nozzle plate 28 is substantially rectangular and is aligned with the semiconductor chip 10 so that the nozzle holes 34 are in axial alignment with corresponding heater resistors 24 on the chip 10. The nozzle plate 28 is preferably tacked to the semiconductor chip 10 using at least two adhesive dots 38 which are provided on at least diagonally opposed corners of the nozzle plate 28. It is preferred to use at least two adhesive dots 38 and preferably four adhesive dots 38 on the four corners of the nozzle plate 28 to tack the nozzle plate 28 to the semiconductor chip 10 after aligning the nozzle plate 28 to the chip 10.

The tack and hold adhesive used to provide adhesive dots 38 is preferably formulated to contain a UV curable portion having a cure time when exposed to actinic radiation of less than about one second. The adhesive also contains a portion which effectively increases the cross-link density of the adhesive which may be cured over a longer period of time by heat and/or pressure. The adhesive dots 38 are preferably applied to the nozzle plate 28 or semiconductor chip 10 in a pattern which does not interfere with the flow features of the nozzle plate. Once cured, the adhesive dots 38 preferably have a thickness ranging from about 20 to about 40 microns and a diameter ranging from about 200 to about 400 microns.

The tack and hold adhesive for adhesive dots 38 is preferably a mixture of a multifunctional epoxy material and a difunctional epoxy material. In addition to the epoxy materials, the mixture also preferably contains a mixed aryl sulfonium salt photoinitiator, an imidazole-based thermal initiator and a fumed silica viscosity control agent. Such an adhesive is preferably curable by actinic radiation and thermally. It is also particularly preferred that the cured adhesive exhibit chemical resistance to inks of the type used in the ink jet pen. Such inks include pigment-based and dye-based inks. Suitable dye-based inks are described, for example, in U.S. Pat. No. 5,364,461 to Beach et al. and U.S. Pat. No. 5,981,623 to McCain et al. Pigment-based inks are described, for example, in U.S. Pat. No. 5,925,692 to Kappele et al.

The multifunctional epoxy material component of the adhesive for adhesive dots 38 may be selected from aromatic epoxides such as glycidyl ethers of polyphenols. A particularly preferred multifunctional epoxy resin is a polyglycidyl ether of phenolformaldeyhyde novolac resin such as the novolac epoxy resin having an epoxide equivalent weight ranging from about 172 to about 179 and a viscosity at 25° C. ranging from about 3,000 to about 5,000 centipoise which is available from Dow Chemical Company of Midland, Mich. under the trade name D.E.N. 431. The amount of multifunctional epoxy resin in the tack and hold adhesive formulation preferably ranges from about 15 to about 35 percent by weight of the formulation, most preferably from about 20 to about 25 percent by weight of the total formulation weight.

The difunctional epoxy material component of the tack and hold adhesive formulation for adhesive dots 38 is preferably selected from difunctional epoxy compounds which include diglycidyl ethers of bisphenol-A (e.g. those available under the trade designations "EPON 828", "EPON 1004", "EPON 1001F", "EPON SU-8" and "EPON 1010", available from Shell Chemical Company of Houston, Tex., "DER-331", "DER-332", and "DER-334", available from Dow Chemical Company of Midland, Mich., 3,4-epoxycyclohexylmethyl-3,4-epoxycyclo-hexene carboxylate (e.g. "ERL-4221" available from Union Carbide Corporation of Danbury, Conn., 3,4-epoxy-6-methylcyclohexylmethyl-3,4-epoxy-6-methylcyclohexene carboxylate (e.g. "ERL-4201" available from Union Carbide Corporation), bis(3,4-epoxy-6-methylcyclohexylmethyl) adipate (e.g. "ERL-4289" available from Union Carbide Corporation), and bis(2,3-epoxycyclopentyl) ether (e.g. "ERL-0400" available from Union Carbide Corporation.

A particularly preferred difunctional epoxy resin is a bisphenol-A/epichlorohydrin epoxy resin available from Shell Chemical Company of Houston, Tex. under the trade name EPON resin 828. The amount of difunctional epoxy resin in the tack and hold adhesive formulation preferably ranges from about 40 to about 80 percent by weight of the formulation, most preferably from about 60 to about 65 percent by weight of the formulation.

The tack and hold adhesive for adhesive dots 38 also preferably contains a photoinitiator, a thermal initiator and a viscosity control agent. The photoinitiator is preferably a compound or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating moieties which initiate reactions with epoxides. The aromatic complex salt is preferably present in the tack and hold adhesive composition in an amount ranging from about 0.5 to about 1.5 weight percent, preferably from about 0.75 to about 0.9 weight percent, based on the total weight of the adhesive composition.

Of the aromatic complex salts which are suitable for use in the compositions of the invention the preferred salts are triaryl-substituted sulfonium salts as described above. Of the triaryl-substituted sulfonium complex salts which are suitable for use in the compositions of the invention the most preferred salt is a mixture of triarylsulfonium hexafluoroantimonate salt, commercially available from Union Carbide Corporation under the trade name CYRACURE UVI-6974.

The thermal initiator component of adhesive for adhesive dots 38 used to tack the nozzle plate 28 to the chip 10 is preferably an amine adduct of an epoxy compound. The imidazole component of the thermal initiators may be selected from 2-ethyl-4-methylimidazole, 2-methylimidazole, 2-ethylimidazole, 2-phenylimidazole 1-(-2-hydroxy-3-phenoxypropyl)-2-methylimidazole, 1-(2-hydroxy-3-phenoxypropyl)-2-ethyl-4-methylimidazole, 1-(2-hydroxy-3-butoxypropyl)-2-methylimidazole, 2-mercaptobenzoimidazole and 1-(2-hydroxy-3-butoxypropyl)-2-ethyl-4-methylimidazole. The epoxy component of the thermal initiator may be selected from the group consisting of polyglycidyl ethers, glycidyl ether esters, polyglycidyl esters, glycidylamine compounds, epoxidized phenolic novolac resins, epoxidized cresolnovolac resins, epoxidized polyolefins, butyl glycidyl ethers, phenyl glycidyl ethers and glycidyl methacrylate. Accordingly, the most preferred thermal initiator is available from Ajinomoto Co., Inc. of Tokyo, Japan under the trade name AJICURE MY 24. The amount of thermal initiator in the adhesive preferably ranges from about 5 to about 15 percent by weight, most preferably from about 8 to about 10.5 percent by weight.

The adhesive dots 38 preferably have a viscosity which enables placement of the adhesive on the nozzle plate 28 or semiconductor chip 10 in predetermined locations so that the adhesive dots 38 do not flow and interfere with the flow features of the nozzle plate including ink flow channel 48 and ink chamber 50 (FIG. 3). If the viscosity of the adhesive is too high, it may be difficult to apply the proper amount of adhesive is predetermined locations. If the adhesive in the dots has too low a viscosity, it will be difficult for the adhesive to remain in the predetermined location during the assembly until a portion of the adhesive dots 38 is cured. Accordingly, the viscosity of the adhesive preferably ranges from about 40,000 to about 80,000 centipoise at 25° C., most preferably from about 55,000 to about 65,000 centipoise. A HAAKE viscometer VT500 available from Haake USA of Paramus, N.J., having a PK 1-1° spindle at a setting speed of one was used to obtain the viscosity of the adhesive.

In order to obtain a tack and hold adhesive with the preferred viscosity, the adhesive used for adhesive dots 38 preferably contains a viscosity control agent. The preferred viscosity control agent is a silica compound, preferably an amorphous silicon dioxide compound such as fumed silica. Fumed silica may be treated to make it more hydrophilic or more hydrophobic. A particularly preferred viscosity control agent is polyorganosiloxane treated fumed silica such as polydimethylsiloxane treated fumed silica available from Cabot Corporation of Naperville, Ill. under the trade name CAB-O-SIL TS-720.

The tack and hold adhesive for adhesive dots 38 may be made by mixing together the preferred quantities of the components described above in a suitable vessel. For example, all of the components were added to the mix can of a double-planetary mixer. The ingredients were then mixed at room temperature and atmospheric pressure at about 30 rpm for about 15 minutes and then the mixer speed was raised to about 60 rpm and the ingredients were mixed under a subatmospheric pressure of about 0.5 mm Hg for about 1 hour. The mixed adhesive formulation was then dispensed into 30 cubic centimeter cartridges. The shelf-life of the resulting adhesive at about −40° C. was about 6 months.

Prior to attaching the nozzle plate 28 and semiconductor chip 10 to one another, the nozzle plate 28 and chip 10 are preferably aligned optically so that the nozzle holes 34 in the nozzle plate 28 align with heater resistors 24 on the semiconductor chip 10. Misalignment between the nozzle holes 34 and the heater resistor 24 may cause problems such as misdirection of ink droplets from the pen, inadequate droplet volume or insufficient droplet velocity. Accordingly, nozzle plate/chip assembly 28/10 alignment is critical to the proper functioning of an ink jet pen.

At least a portion of the adhesive dots 38 used to tack the nozzle plate 28 to the chip 10 is not shielded by the nozzle plate 28 and is preferably exposed to actinic radiation to quickly cure and hold the nozzle plate 28 and semiconductor chip 10 in alignment. Suitable actinic radiation includes visible light, ultraviolet light, electron beam, x-ray, gamma-ray, beta-ray and the like. A preferred actinic radiation for partially curing adhesive dots 38 is UV radiation having a wavelength in the range of from about 200 to about 400 nanometers. The adhesive dots 38 are preferably exposed to ultraviolet radiation for a period of time ranging from about 0.5 to about 20 seconds. Because a portion of the adhesive dots 38 is cured immediately, there is less tendency for the nozzle plate 28 and chip 10 to become misaligned during subsequent assembly and curing steps for making the ink jet pen. The adhesive dots 38 may be applied to the nozzle plate 28 or semiconductor chip 10 using a needle-like adhesive dot 38 placement device or any other method known to those of skill in the art.

The nozzle plate 28 is also bonded to the semiconductor chip 10 by use of an adhesive layer 30 (FIGS. 2 and 3). The adhesive layer 30 may be a heat curable adhesive such a B-stageable thermal cure resin, including, but not limited to phenolic resins, resorcinol resins, epoxy resins, ethylene-urea resins, furane, resins, polyurethane resins and silicone resins. The adhesive layer 30 is preferably cured before attaching the chip 10 to a cartridge body and the adhesive layer 30 preferably has a thickness ranging from about 1 to about 25 microns. The adhesive layer 30 is preferably a phenolic butyral adhesive which is cured by heat and pressure once the nozzle plate 28 is aligned and tacked to the semiconductor chip 10 using adhesive dots as described above.

Once the nozzle plate 28 and semiconductor chip 10 are fixedly attached to one another and the adhesive dots 38 exposed to actinic radiation sufficient to cure at least a portion of the adhesive in dots 38, heat and pressure are applied to the nozzle plate/chip assembly 28/10 to cure adhesive 30. During the thermal curing cycle for adhesive layer 30, the adhesive dots 38 are preferably exposed to a temperature in excess of about 80° C., most preferably a temperature in the range of from about 80 to about 120° C. for a period of time ranging from about 15 minutes to about 2 hours to thermally cure any portion of the adhesive dots 38 not cured by actinic radiation. Curing of adhesive layer 30 also completes the cure of adhesive dots 38 since only a portion of the adhesive dots 38 are exposed to actinic radiation.

After attaching the nozzle plate 28 to the chip 10, the semiconductor chip 10 of the nozzle plate/chip assembly 28/10 is electrically connected to the flexible circuit or TAB circuit 40. Chip 10 preferably includes contact pads 42 for electrical connection with the TAB circuit or flexible circuit 40. Subsequent to curing adhesive 30, the nozzle plate/chip assembly 28/10 is attached to the cartridge body 44 of an ink jet printhead using a die bond adhesive. The nozzle plate/chip assembly 28/10 is preferably attached to the cartridge body 44 in a chip pocket 46 of the cartridge body. The die bond adhesive seals around the edges of the semiconductor chip 10 to provide a substantially liquid tight seal to inhibit ink from flowing between the chip 10 and the chip pocket 46.

The die bond adhesive used to attached the nozzle plate/chip assembly 28/10 to the cartridge body 44 is preferably an epoxy adhesive such as a die bond adhesive available from Emerson & Cuming of Monroe Township, N.J. under the trade name ECCOBOND 3193-17. In the case of a thermally conductive cartridge body, the die bond adhesive is preferably a resin filled with thermal conductivity enhancers such as silver or boron nitride. A preferred thermally conductive die bond adhesive is POLY-SOLDER LT available from Alpha Metals of Cranston, R.I. A suitable die bond adhesive containing boron nitride fillers is available from Bryte Technologies of San Jose, Calif. under the trade designation G0063. The thickness of adhesive preferably ranges from about 25 microns to about 125 microns. Heat is typically required to cure adhesive and fixedly attach the nozzle plate/chip assembly 28/10 to the cartridge body.

Once the nozzle plate/chip assembly 28/10 is attached to the cartridge body 44, the flexible circuit or TAB circuit 40 is attached to the cartridge body 44 using a heat activated or pressure sensitive adhesive. Preferred pressure sensitive adhesives include, but are not limited to phenolic butyral adhesives, acrylic based pressure sensitive adhesives such as AEROSET 1848 available from Ashland Chemicals of Ashland, Ky. and phenolic blend adhesives such as SCOTCH WELD 583 available from 3M Corporation of St. Paul, Minn. The adhesive preferably has a thickness ranging from about 25 to about 200 microns.

In order to control the ejection of ink from the nozzle holes 34, each semiconductor chip 10 is electrically connected to a print controller in the printer to which the pen is attached. Connections between the print controller and the resistors 24 of pen are provided by electrical traces which terminate in contact pads 42 on the semiconductor chip 10. The contact pads for each trace and resistor 24 are connected to a flexible circuit or TAB circuit 40 as described above. Electrical TAB bond or wire bond connections are made between the flexible circuit or TAB circuit and the contact pads 42 on the semiconductor chip 10

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. A method for making an ink jet pen for an ink jet printer comprising applying a resin layer containing radiation curable resin formulation to a surface of a semiconductor chip containing resistive and conductive layers on the surface thereof to provide a cured resin layer having a thickness ranging from about 1 to about 5 microns, the radiation curable resin formulation including a multifunctional epoxy component, a difunctional epoxy component having a weight average molecular weight above about 2500, a silane coupling agent, an aryl sulfonium salt photoinitiator, a non-photoreactive solvent, and the resin formulation being substantially devoid of acrylate polymer components, removing solvent from the resin layer, curing the resin layer by exposure to actinic radiation to provide a cured resin layer, aligning and attaching a nozzle plate to the semiconductor chip with an adhesive to provide a nozzle plate/chip assembly, and attaching a TAB circuit or flexible circuit to the nozzle plate/chip assembly, wherein the cured resin layer contains from about 60 to about 85 weight percent of the difunctional epoxy component and from about 12 to about 22 weight percent of the photoinitiator.

2. The method of claim 1 wherein the multifunctional epoxy component comprises a polyglycidyl ether of phenol-formaldehyde novolac resin.

3. The method of claim 1 wherein the difunctional epoxy component comprises a bisphenol-A/epichlorohydrin epoxy.

4. The method of claim 1 wherein the cured resin layer comprises from about 65 to about 75 percent by weight of the difunctional epoxy componet.

5. The method of claim 4 wherein the cured resin layer comprises from about 8 to about 10 percent by weight of the multifunctional epoxy component.

6. The method of claim 1 wherein the silane coupling agent comprises gamma-glycidoxypropyltrimethoxysilane.

7. The method of claim 1 wherein the photoinitiator comprises a mixed triarylsulfonium hexafluorophosphate salt.

8. The method of claim 1 wherein the radiation curable resin layer comprises from about 15 to about 20 percent by weight aryl sulfonium salt photoinitiator.

9. The method of claim 1 wherein the cured resin layer comprises a planarization layer.

10. A printhead for an ink jet printer comprising an ink jet pen made by the method of claim 1.

* * * * *

UNITED STATES PATENT AND TRADEMARK OFFICE
CERTIFICATE OF CORRECTION

PATENT NO. : 6,830,646 B2
DATED : December 14, 2004
INVENTOR(S) : Girish S. Patil et al.

It is certified that error appears in the above-identified patent and that said Letters Patent is hereby corrected as shown below:

<u>Column 14,</u>
Line 3, replace "componet" with -- component --.

Signed and Sealed this

Tenth Day of May, 2005

JON W. DUDAS
*Director of the United States Patent and Trademark Office*